US006587992B2

(12) United States Patent
Marple

(10) Patent No.: US 6,587,992 B2
(45) Date of Patent: Jul. 1, 2003

(54) TWO DIMENSIONAL COMPACTION SYSTEM AND METHOD

(75) Inventor: David P. Marple, Palo Alto, CA (US)

(73) Assignee: QDA, Inc., Palo Alto, CA (US)

( * ) Notice: Subject to any disclaimer, the term of this patent is extended or adjusted under 35 U.S.C. 154(b) by 0 days.

(21) Appl. No.: 10/177,992

(22) Filed: Jun. 20, 2002

(65) Prior Publication Data

US 2003/0009728 A1 Jan. 9, 2003

Related U.S. Application Data

(60) Provisional application No. 60/301,994, filed on Jun. 29, 2001.

(51) Int. Cl.[7] .............................................. G06F 17/50
(52) U.S. Cl. .................................. 716/2; 716/9; 716/11
(58) Field of Search ........................... 716/2, 7–18, 3–5

(56) References Cited

U.S. PATENT DOCUMENTS

| | | | | |
|---|---|---|---|---|
| 4,630,219 A | * | 12/1986 | DiGiacomo et al. | 716/9 |
| 4,815,003 A | * | 3/1989 | Putatunda et al. | 716/9 |
| 5,267,177 A | | 11/1993 | Sato et al. | 364/391 |
| 5,381,343 A | | 1/1995 | Bamji et al. | 364/488 |
| 5,483,461 A | * | 1/1996 | Lee et al. | 716/14 |
| 5,493,509 A | | 2/1996 | Matsumoto et al. | 364/491 |
| 5,535,134 A | | 7/1996 | Cohn et al. | 364/491 |
| 5,557,533 A | * | 9/1996 | Koford et al. | 716/9 |
| 5,625,568 A | | 4/1997 | Edwards et al. | 364/491 |
| 5,636,132 A | | 6/1997 | Kamdar | 364/491 |
| 5,640,497 A | | 6/1997 | Woolbright | 395/133 |
| 5,663,892 A | | 9/1997 | Hayashi et al. | 364/491 |
| 5,689,433 A | | 11/1997 | Edwards | 364/490 |
| 5,847,965 A | * | 12/1998 | Cheng | 716/9 |
| 6,189,132 B1 | * | 2/2001 | Heng et al. | 716/11 |
| 6,351,841 B1 | | 2/2002 | Tickle | 761/8 |

OTHER PUBLICATIONS

"A VLSI Artwork Legalization Technique Based on a New Criterion of Minimum Layout Perturbation" by Heng et al., ISPD 1997, pp. 116–121.

"A Hierarchy Preserving Hierarchical Compactor" by Marple, 27th DAC Proceedings, Jun. 1990, pp. 375–381.

"An Efficient Compactor for 45° Layout" by Marple et al., 25th DAC Proceedings, Jun. 1988, pp. 396–402.

"Efficient Generation of Diagonal Constraints for 2–D Mask Compaction" by Bois et al., IEEE Transactions on CAD, Sep. 1996, vol. 15, No. 9, pp. 1119–1126.

"Two–Dimensional Module Compaction Based on 'Zone–Refining'" by Shin et al., IEEE ICCD Proceedings, May. 1987, pp. 201–204.

"Graph Optimization Techniques for IC Layout and Compaction" by Kedem et al., IEEE Transactions on CAD, Jan. 1984, vol. 3, No. 1, pp. 12–20.

"A New Method for Hierarchical Compaction" by Rulling et al., IEEE Transactions on CAD, Feb. 1993, vol. 12, No. 2, pp. 353–360.

"Leaf Cell and Hierarchical Compaction Techniques" by Bamji et al., Kluwer Academic Publishers, 1997.

* cited by examiner

Primary Examiner—Matthew Smith
Assistant Examiner—Paul Dinh
(74) Attorney, Agent, or Firm—Robert Moll

(57) ABSTRACT

The present invention relates to layouts with geometrical objects, and more particularly, to a system and method for compacting layouts in two dimensions simultaneously. In an embodiment, the system and method of the present invention are applied to IC layouts. The present invention provides for compacting layouts in two dimensions at once without depending on expensive methods such as Branch and Bound. As a result, in an embodiment, the present invention can be applied to large layouts in much the same way as conventional, one dimensional compaction systems and methods. The present invention also provides for compacting hierarchical layouts in two dimensions at once while preserving the complete hierarchy.

19 Claims, 8 Drawing Sheets

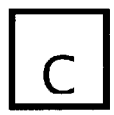
Source layout
Layout after compacting horizontally only then vertically only
Figure 1(a)
Figure 1(b)
Layout after compacting vertically only then horizontally only
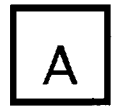
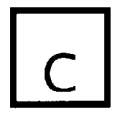
Layout after compacting in both dimensions simultaneously
Figure 1(c)
Figure 1(d)

Figure 5 – All possible cell instance orientations

TWO DIMENSIONAL COMPACTION SYSTEM AND METHOD

This application claims the benefit of priority to U.S. provisional application No. 60/301,994, filed on Jun. 29, 2001, and incorporates by reference the entire subject matter of the provisional application.

BACKGROUND OF INVENTION

The present invention relates to layouts composed of geometrical objects, such as polygons, lines and points, and more specifically to a system and method for enforcing design rules and optimizing geometrical objectives for layouts in integrated circuits.

Prior to producing masks needed for the manufacture of integrated circuits (ICs), every IC layout must satisfy complex design rules specific to the IC manufacture technology. These design rules are usually geometric in nature, and may include, for example, minimum area, width, spacing, overlap and/or enclosure requirements on the IC layout. The rules generally apply to all regions of an IC layout and apply over a two dimensional space involving one or more layers. By obeying all design rules for a given IC technology and all circuit requirements of the IC design, such as connectivity, wire widths and device sizes, the IC layout will yield functional and manufacturable chips.

IC layouts are generally partitioned into a hierarchical structure involving cell masters, whereby cell masters are referenced by one or more cell instances, and each cell master in turn may contain layout objects and/or other cell instances. A hierarchical organization of an IC layout is needed to efficiently represent repeated structures and to manage large complex ICs or IC components. For highly regular layouts, array structures are used to represent rows and/or columns of repeated cell instances.

For most IC layouts, layout designers manually produce the cells composing a layout with the aid of graphical layout editors. Once drawn, the cells must be verified with design rule and circuit verification programs and altered to fix violations. This is a tedious and costly process and often must be repeated for every IC technology that will be used to manufacture chips containing the cells. The process of transforming an existing layout obeying design rules of some IC technology to a new layout obeying design rules of a different IC technology is called layout migration. Though layout migration is easier than the initial creation of a IC layout, it is usually done manually with layout designers since automation of layout migration is very difficult.

To date, the primary automation method applied to the problem of transforming an existing IC layout to a new layout obeying design rules of a target IC technology is compaction. Compaction is a method used to optimize a given IC layout subject to a set of design rule constraints. The layout is optimized by minimizing the total layout area as well as the length of wires and area of other layout objects. The layout objects are constrained by design rule interactions and circuit connectivity and parameter requirements and must be positioned without violating any such constraint. Almost all compaction methods are performed in one dimension at a time and often on one cell at time. This is done to simplify the compaction problem to the point that the problem can be solved by efficient solving algorithms. To completely compact a layout in two dimensions, compaction must be performed in the vertical direction, or Y direction in Cartesian coordinates, then the horizontal direction, or X direction in Cartesian coordinates. A layout could also be compacted first in the horizontal direction followed by compaction in the vertical direction.

Each time compaction is performed, four steps must be conducted. The first step is to model layout objects or layout object edges with position variables and define an objective function that is a weighted sum of position variables. The next step is to create constraints between layout objects or edges based on the design rules of the target IC technology and circuit requirements of the target IC design. The constraints are modeled as linear mathematical relations involving a two or more position variables. The third step is to solve the mathematical problem of minimizing the objective function subject to the linear constraint relations using a known linear program solving algorithm. The last step is to update the layout objects with the solution from the solving algorithm.

When compaction is performed in one dimension on a single cell, the compaction model defaults to a constraint graph problem, where nodes in the graph represent position variables and arcs in the graph represent linear constraints. The resulting problem can be solved with a Network Flow Simplex algorithm, which is very efficient in practice. Further details on compaction modeled with constraint graphs can be found in "An Efficient Compactor for 45° Layout", 25th Design Automation Conference, Anaheim, Calif., June 1988, pp. 396–402. When compaction is performed in one dimension on a hierarchical layout and the hierarchy is to be preserved, the compaction model is a general linear program, which can be solved by sparse implementations of the Revised Simplex algorithm. Further details on compaction modeled with linear programs can be found in "A Hierarchy Preserving Hierarchical Compactor", 27th Design Automation Conference, Orlando, Fla., June 1990, pp. 375–381. Additional details on compaction can be found in "Leaf Cell and Hierarchical Compaction Techniques", by Cyrus Bamji and Ravi Varadarajan, Kluwer Academic Publishers, Norwell Mass., 1997.

Compacting a layout in one dimension at a time does not always produce the best result. Moreover, the result varies depending on which direction the first compaction is performed. Consider the example layout shown in FIG. 1(a). This layout contains four layout objects A, B, C and D which are all assigned the same layer and must be spaced apart by a minimum spacing design rule. If this layout is compacted in the vertical direction only, then in the horizontal direction only, the layout shown in FIG. 1(c) results. If the layout in FIG. 1(a) is compacted in the horizontal direction only, then in the vertical direction only, the layout shown in FIG. 1(b) results. The best result that is possible is shown in FIG. 1(d), which can not be easily produced by compacting in one dimension at a time. The layouts in FIGS. 1(b), 1(c) and 1(d) all obey the minimum spacing design rules of the target IC technology, but only the layout in FIG. 1(d) occupies the smallest area, which would be the lowest cost to manufacture.

Compacting a layout in both dimensions simultaneously usually produces better results than compacting in one dimension at a time. By compacting in two dimensions at once, the layout in FIG. 1(a) can be transformed to the layout in FIG. 1(d). However, one of the difficulties of two dimensional compaction methods is with corner to corner interactions. Examples of such interactions can be found in FIG. 1(a), namely the bottom right corner of layout object A to the top left corner of layout object B, the top right corner of layout object C to the bottom right corner of layout object B, and the bottom right corner of layout object B to the top left corner of layout object D. To date, two dimensional compaction methods handle corner to corner interactions with Branch and Bound or other expensive algorithms, which have execution times that grow exponentially with the size of the layout. Though these methods produce good results, these methods can only be applied to small layouts such as a single cell. Further details on two dimensional compaction methods can be found in "Efficient Generation of Diagonal Constraints for 2-D Mask Compaction", IEEE Transactions on Computer-Aided Design of Integrated Circuits and Systems, Vol. 15, No. 9, September 1996, pp. 1119–1126 and "Two-Dimensional Layout Compaction by Simulated Annealing", IEEE International Symposium on Circuits and Systems, August 1988, pp. 2439–2443.

Therefore, a need exists for a two dimensional compaction method that can handle large IC layouts efficiently and still yield quality results. Moreover, to handle even larger layouts with some regularity or repeated cell instances, a need exists for a two dimensional compaction method that operates on hierarchical layouts and preserves the layout hierarchy. For somewhat regular layouts using hierarchy, such a method would provide additional efficiency for layout migration and compaction. Another benefit of two dimensional compaction methods for large layouts with or without hierarchy is to simplify the usage of the compaction technology, since the user need not choose a starting direction as needed with one dimensional compaction methods.

SUMMARY OF INVENTION

The present invention relates to layouts with geometrical objects, and more particularly, to a system and method for compacting layouts in two dimensions simultaneously. In a particularly useful embodiment, the system and method of the present invention are applied to IC layouts. The present invention provides an efficient means for compacting layouts in two dimensions at once without depending on expensive methods such as Branch and Bound. As a result, the present invention can be applied to large layouts in much the same way as conventional, one dimensional compaction systems and methods.

The present invention also provides an efficient means for compacting hierarchical layouts in two dimensions at once while preserving the complete hierarchy. The present invention also solves the problem of preserving hierarchy with cell instances of the same cell master at orthogonal orientations to each other, which usually occurs with chip bonding pad circuits, sometimes referred to as Input/Output buffers.

The present invention also handles layout objects with edges at any angle and alters the length of all edges as part of two dimensional compaction. In a particularly useful embodiment of the present invention, edges are limited to 45° multiple angles which stretch or shrink during compaction. The present invention also handles general circuit requirements, including device sizes that are a function of two dimensions. The present invention not only provides an elegant solution to the general compaction of hierarchical layout in two dimensions, it also finds quality solutions quickly and with no manual help or interaction.

BRIEF DESCRIPTION OF DRAWINGS

FIG. 1(a) shows an example source layout with four layout objects.

FIG. 1(b) shows the layout of FIG. 1(a) compacted horizontally only, then vertically only.

FIG. 1(c) shows the layout of FIG. 1(a) compacted vertically only, then horizontally only.

FIG. 1(d) shows the layout of FIG. 1(a) compacted in both dimensions simultaneously.

DETAILED DESCRIPTION

For the purposes of this disclosure, a layout includes a collection of polygons, lines or points, or other two dimensional objects with an assigned layer. A hierarchical layout includes two or more cell masters and one or more cell instances of each of the masters, except for the top of the hierarchy. A layout edge is the edge of a polygon or line and a layout point is the corner of a polygon, endpoint of a line, or a point. Layout edges form the boundary of layout objects such as transistors, vias, or wires. A text label is a layout point with associated formatted text. An array instance is a cell instance arrayed in one or two dimensions in a regular pattern, such as a row, column or matrix of cell instances of the same cell master.

Figure 2A:
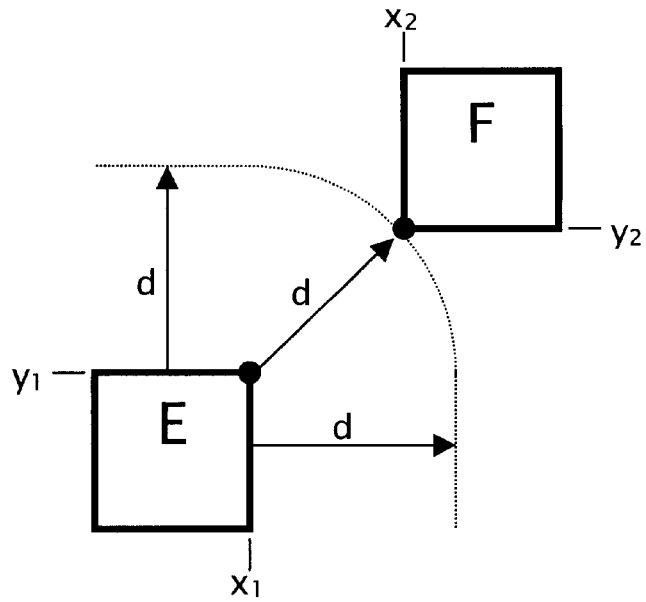
FIG. 2(a) shows two layout objects with a corner to corner design rule interaction.

The position of a given vertical edge $e_i$ in Cartesian coordinates is represented by a position variable $x_i$ and the position of a given horizontal edge $e_j$ in Cartesian coordinates is represented by a position variable $y_j$. Referring now to FIG. 2(a) for an example, the right and top edges of layout object E are represented by position variables $x_1$ and $y_1$, respectively, and the left and bottom edges of layout object F are represented by position variables $x_2$ and $y_2$, respectively. The layout object F is to remain above and/or right of layout object E by a distance d, which corresponds to a minimum spacing design rule distance between objects E and F. Keeping object F right of E is represented by the linear constraint $x_2-x_1>d$, keeping object F above E is represented by the linear constraint $y_2-y_1>d$, and keeping object F above and right of E is represented by the nonlinear constraints $(x_2-x_1)^2+(y_2-y_1)^2>d^2$ as well as linear constraints $x_2>x_1$ and $y_2>y_1$. Since nonlinear constraints are more difficult to enforce in mathematical programming, a linear approximation to this constraint is used instead with a slight degradation in the closest possible spacing of E to F.

Keeping F above and right of E is represented instead by the single linear constraint $(y_2-y_1)+(x_2-x_1)>\sqrt{2}\ d$. The choice of keeping F above E, right of E or diagonally opposed to E is made before constraints are generated and solved by a linear program method. If the wrong choice was made after solving, heuristics can be applied to change this choice. In practice, few changes are needed and a good result is obtained without employing Branch and Bound methods.

Figure 2B:
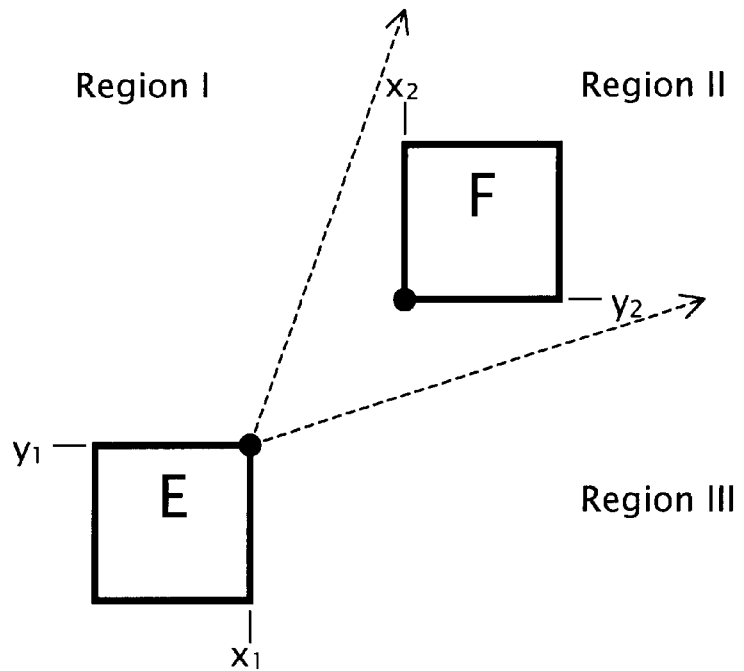
FIG. 2(b) shows the regions considered for classifying constraints around layout object corners.

FIG. 2(b) shows how the initial choice of constraint E to F is made based on the starting positions of E and F in the source layout. If the bottom edge of F overlaps region I, then the initial constraint is $y_2-y_1>d$. If the right edge of F overlaps region III, then the initial constraint is $x_2-x_1>d$. If the bottom right corner of F lies in region II, then the initial constraint is $(y_2-y_1)+(x_2-x_1)>\sqrt{2}\,d$. Though the preferred embodiment of the present invention is to consider three regions for corner to corner interactions, the method also applies for two regions, in which case F would be strictly above or right of E by distance d, or for four or more regions with similar linear constraints for each region.

To generalize the method for any pair of adjacent or interacting layout objects or edges, constraints are generated to enforce design rules horizontally with linear constraints of the form $x_i-x_j>d_{ij}$, vertically with linear constraints of the form $y_j-y_i>d_{ij}$, or diagonally with linear constraints of the form $(y_j-y_i)+(x_j-x_i)>\sqrt{2}\,d_{ij}$ or of the form $(y_j-y_i)-(x_j-x_i)>\sqrt{2}\,d_{ij}$. For each case, the choice of constraint depends on the initial positions of the interacting objects or edges. Parallel vertical edges with a common y coordinate are constrained horizontally, parallel horizontal edges with a common x coordinate are constrained vertically, and parallel diagonal edges with a 45° slope are constrained diagonally as $(y_j-y_i)+(x_j-x_i)>\sqrt{2}\,d_{ij}$ and parallel diagonal edges with a 135° slope are constrained diagonally as $(y_j-y_1)-(x_j-x_i)>\sqrt{2}\,d_{ij}$. Corner to diagonal edge interactions are constrained diagonally. Corner to corner interactions, such as illustrated in FIG. 2, are constrained based on the angle $a_{ij}$ formed between the interacting corners where we assume $a_{ij}$ is between 0° and 180°. The corners are constrained horizontally as $x_i-x_j>d_{ij}$ if $a_{ij}$ is less that 22.5° or more than 147.5°, vertically as $y_j-y_i>d_{ij}$ if $a_{ij}$ is between 67.5° and 112.5°, diagonally as $(y_j-y_i)+(x_j-x_i)>\sqrt{2}\,d_{ij}$ if $a_{ij}$ is between 22.5° and 67.5° or diagonally as $(y_j-y_i)-(x_j-x_i)>\sqrt{2}\,d_{ij}$ if $a_{ij}$ is between 112.5° and 147.5°.

Figure 3:
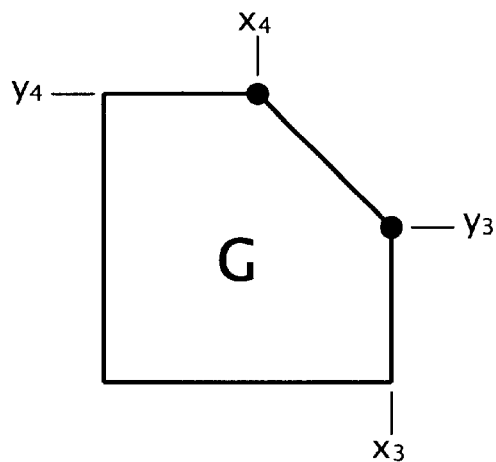
FIG. 3 shows an example layout object with a diagonal edge.

The position of a given diagonal edge $e_k$ is represented by the position variables at either end point of the edge. In general, one position variable is allocated to each horizontal or vertical edge of a layout object and two position variables are allocated to each diagonal edge of a layout object. The angle of every diagonal edge is constrained to remain at the same angle by linear constraints of the form $x_j-x_i=y_j-y_i$ or of the form $x_j-x_i=y_i-y_j$, where the former constraint enforces a 45° slope and the later constraint enforces a 135° slope, with the lower end point at $(x_i, y_i)$ and upper end point at $(x_j, y_j)$. This method can be generalized for diagonal edges at any angle, where the angle is to remain constant during compaction. By way of example, FIG. 3 shows a diagonal edge on layout object G at a 135° slope. The top edge of G is represented by the position variable $y_4$ and the right edge of G by the position variable $x_3$. Then the additional position variables $x_4$ and $y_3$ fully define the position of the diagonal edge of G. To keep the diagonal edge of G at a 135° slope, the linear constraint $x_3-x_4=y_4-y_3$ is generated as part of the present invention.

Figure 4:
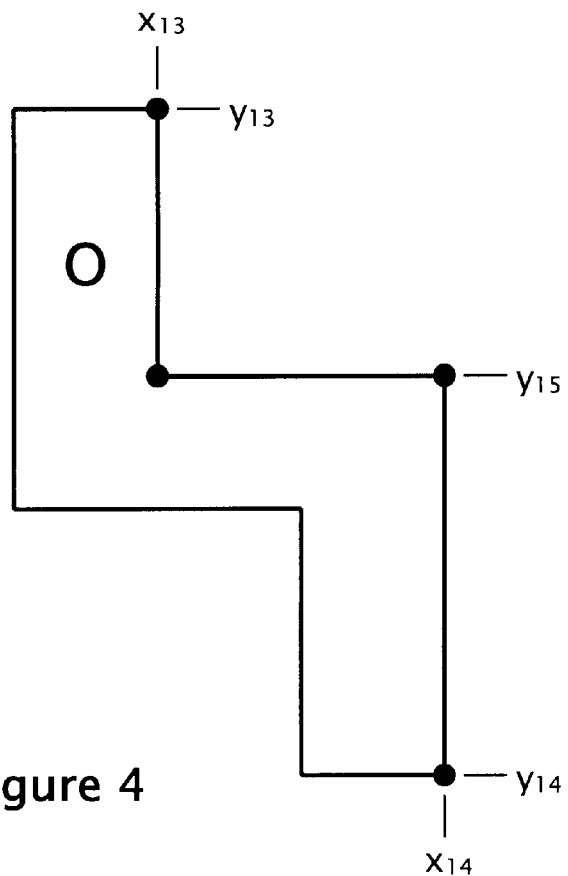
FIG. 4 shows all possible cell instance orientations for hierarchical layouts.

Circuit requirements for IC layouts can be modeled as linear constraints, including connectivity, and wire width and device size requirements. Connectivity and wire width requirements are similar to design rule interactions and are modeled between pairs of layout edges or objects, with linear constraints of the same form as design rule constraints. Device size requirements can also be modeled as a linear constraint between layout edges or objects, or may require a minimum perimeter type of constraint, which is the linear constraint representing the minimum and/or maximum sum of lengths of adjacent edges along a device. Consider FIG. 4 for an example of a minimum device size constraint for the (layout) device object O. Suppose the side perimeter of O must be at least $w_O$, a constant, to fulfill a minimum device size requirement. In this case, the linear constraint is $(y_{13}-y_{15})+(x_{14}-x_{13})+(y_{15}-y_{14})>w_O$, which simplifies to $y_{13}-y_{14}+x_{14}-x_{13}>w_O$.

Figure 5:
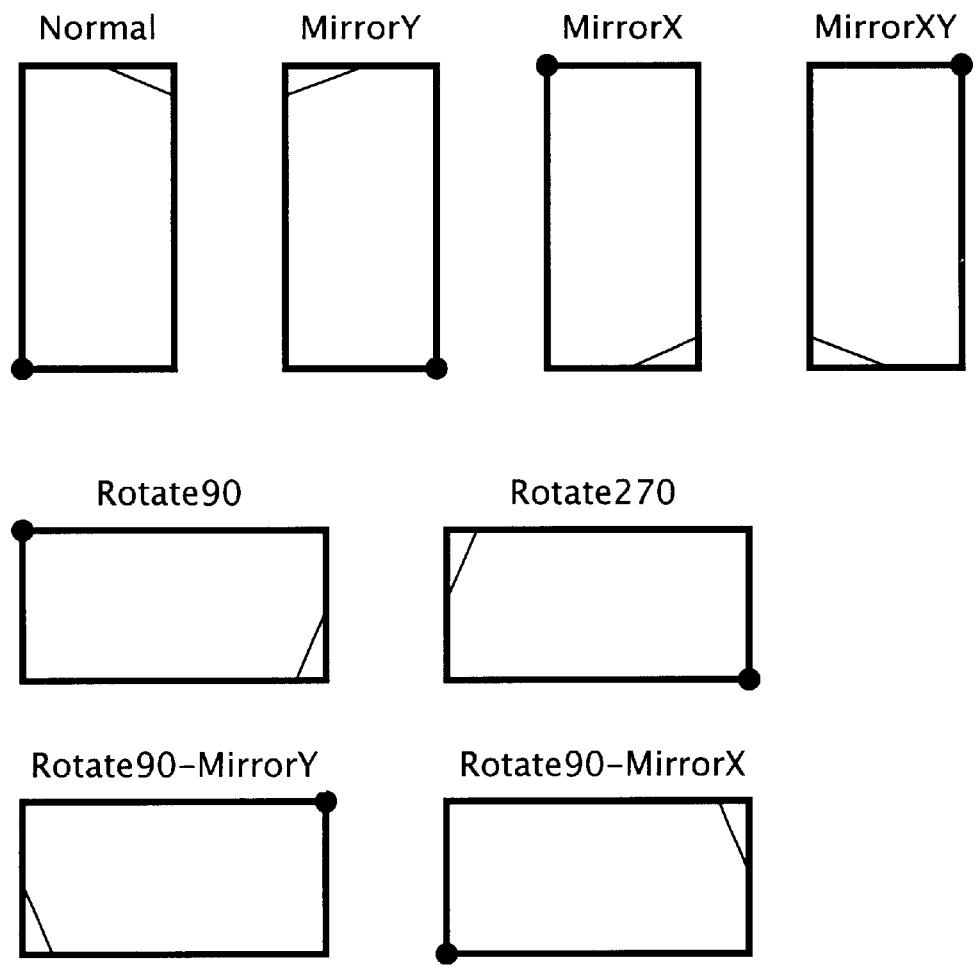
FIG. 5 shows an example complex layout hierarchy with interacting layout objects.

For hierarchical layouts, a cell master may contain layout objects with edges or points and/or cell instances referencing other cell masters. The position of every cell instance $c_i$ contained in a cell master is represented by the position variables $x_i$ and $y_i$. The point $(x_i, y_i)$ represents the origin of the cell instance and all layout objects/edges contained in the cell instance are transformed with respect to this origin and the cell instance's orientation. A cell instance may have one of eight possible orientations as shown in FIG. 5. Each of the orientations shown in FIG. 5 shows the bounding box of the cell instance as a bold black rectangle, the origin of the cell instance as a large black dot, and the orientation of the cell instance as a diagonal line. A Normal orientation means the cell instance references a cell master without any rotation or mirroring. A MirrorY orientation means the cell instance references a cell master flipped sideways and a MirrorX orientation flipped upside down. A MirrorXY orientation means the cell instance references a cell master both flipped sideways and upside down (equivalent to rotated 180°). A Rotate90 orientation means the cell instance references a cell master rotated 90° clockwise and a Rotate270 orientation rotated 270° clockwise (equivalent to 90° counter-clockwise). A Rotate-MirrorY orientation means the cell instance references a cell master first rotated 90° clockwise then flipped sideways and a Rotate90-MirrorX orientation first rotated 90° clockwise then flipped upside down. In general other cell instance orientations are possible, but the preferred embodiment is to support only the eight possible orthogonal orientations.

Figure 6:
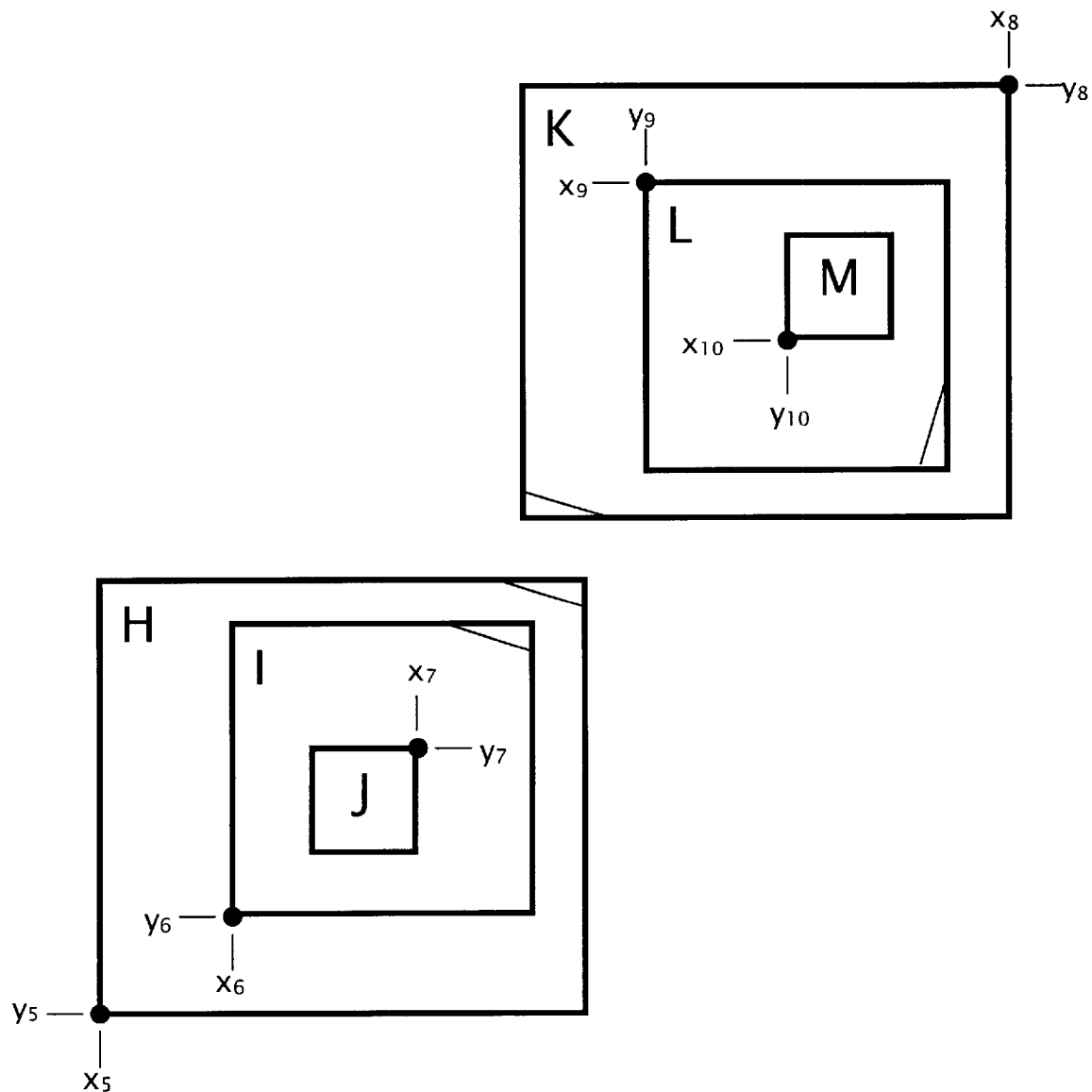
FIG. 6 shows a layout object with a enclosing bounding box.

To illustrate how the absolute position of layout objects instantiated in a complex layout hierarchy is represented, refer to FIG. 6. The top level of the hierarchy in FIG. 6 contains two cell instances H and K. Cell instance H references a cell master containing cell instance I. Cell instance I in turn references another cell master containing layout object J. Cell instance H has a Normal orientation and its origin is located at $(x_5, y_5)$. Cell instance I also has a Normal orientation and its origin with respect to the coordinate system of the master of cell instance H is $(x_6, y_6)$. The upper right corner of layout object J is located with respect to the coordinate system of the master of cell instance I at $(x_7, y_7)$. The absolute position of the upper right corner of J of instance I of instance H is $(x_5+x_6+x_7, y_5+y_6+y_7)$. Cell instance K references a cell master containing cell instance L. Cell instance L in turn references another cell master containing layout object M. Cell instance K has a MirrorXY orientation and its origin is located at $(x_8, y_8)$. Cell instance L has a Rotate orientation and its origin with respect to the coordinate system of the master of cell instance K is $(x_9, y_9)$. The corner of layout object M is located with respect to the coordinate system of the master of cell instance L at $(x_{10}, y_{10})$. The absolute position of the corner of M of instance L of instance K takes into account the non-normal orientations of K and L and is $(x_8-x_9+y_{10}, y_8-y_9-x_{10})$. Suppose object J of I of H requires a design rule spacing d to object M of L of K, similar to the design rule spacing of object E to object F shown in FIG. 2(a). To keep M of L of K above J of I of H requires the linear constraint $(y_8-y_9-x_{10})-(y_5+y_6+y_7)>d$. To keep M of L of K right of J of I of H requires the linear constraint $(x_8-x_9+y_{10})-(x_5+x_6+x_7)>d$. Finally, to keep M of L of K diagonally above and right of J of I of H requires the linear constraint $((y_8-y_9-x_{10})-(y_5+y_6+y_7))+((x_8-x_9+y_{10})-(x_5+x_6+x_7))>\sqrt{2}\,d$.

In general, the present invention models all design rule interactions in two dimensions as general linear constraints even for the most complex hierarchical layout. Design rules are enforced horizontally in the form:

$$\sum_j t_j x_j - \sum_i t_i x_i \geq d_{ij}$$

where an $x_i$ or $x_j$ may represent the x or y position variable of a cell instance or layout edge and $t_i$ or $t_j$ represent the transform coefficient ($\pm 1$) for each level in the hierarchy. Design rules are enforced vertically in the form:

$$\sum_j t_j y_j - \sum_i t_i y_i \geq d_{ij}$$

where a $y_i$ or $y_j$ may represent the x or y position variable of a cell instance or layout edge and $t_i$ or $t_j$ represent the transform coefficient ($\pm 1$) for each level in the hierarchy. Finally, design rules are enforced diagonally in the form:

$$\left(\sum_j t_j y_j - \sum_i t_i y_i\right) \pm \left(\sum_j t_j x_j - \sum_i t_i x_i\right) \geq \sqrt{2}\, d_{ij}$$

where an $x_i$, $x_j$, $y_i$ or $y_j$ may represent the x or y position variable of a cell instance or layout edge and $t_i$ or $t_j$ represent the transform coefficient ($\pm 1$) for each level in the hierarchy. Circuit requirements, such as connectivity, wire width and device sizes, are modeled in the general case similar to the design rule constraint models above.

A cell master in a hierarchical layout may contain array instances referencing other cell masters arrayed in a regular pattern. Similar to a cell instance, the position of every array instance $a_i$ contained in a cell master is represented by the position variables $x_i$ and $y_i$, where the point ($x_i$, $y_i$) represents the origin of the first cell in the array instance. The spacing between rows of an array instance with multiple rows is represented by the (relative) position variable $y_a$ and the spacing between columns of an array instance with multiple columns by the (relative) position variable $x_a$. Array spacing variables arise in linear constraints that enforce design rules, just like cell instance and label edge variables, except the transform coefficients $t_i$ or $t_j$ are integer coefficients. In any event, the present invention still models in two dimensions any complex hierarchy with or without array instances as a linear constraint system.

In recent years, many IC technologies require minimum area design rules, meaning the total area of a layout object or related set of overlapping objects on an assigned layer must be a minimum amount. In general, area can not be precisely modeled as a linear function, since for example the area of a rectangle with height h and width w is hw. As a linear approximation, the present invention handles minimum area design rules as minimum perimeter design rules, where the minimum perimeter amount is derived from the minimum area design rule amount and the minimum width design rule amount. Minimum perimeters can be enforced with linear constraints and therefore consistent with keeping two dimensional compaction modeled with a linear constraint system. In general, a minimum perimeter constraint is more conservative than a minimum area constraint, and the greatest difference occurs for square areas. In practice, however, square areas rarely result after applying the present invention, but rectangular areas with one dimension at minimum width result more frequently. As a result, the approximation of a minimum area constraint as a minimum perimeter constraint yields results which are optimum or near optimum.

Suppose for a given layer l, the minimum area design rule amount is $a_l$ and the minimum width design rule amount is $w_l$. The minimum perimeter for layer l is defined as follows:

$$p_l = 2\left(\frac{a_l}{w_l} + w_l\right)$$

Figure 7:
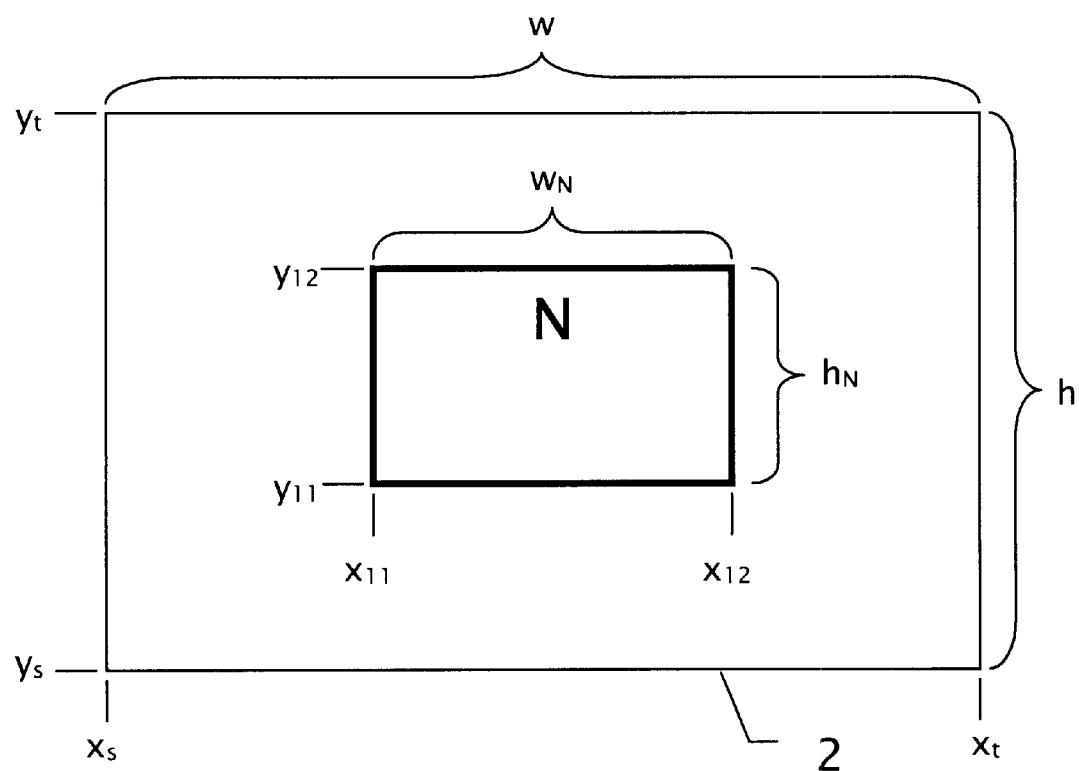
FIG. 7 shows a block/flow diagram for the two dimensional compaction method.

By way of example, consider the rectangular layout object N in FIG. 7. If N is assigned layer l, the minimum area constraint for N is $2(y_{12}-y_{11}+x_{12}-x_{11}) > p_l$, where $p_l$ is treated as constant.

The preferred embodiment of the present invention models design rule interactions, circuit requirements and other constraints as linear constraints and also models the two dimensional compaction objective with or without hierarchy as a linear function of position variables. In general the complete compaction objective is a weighted sum of position variables, where the weights, or coefficients, are selected to minimize the overall area of the layout as well as secondary objectives which can be modeled as a linear function. The top level of the layout hierarchy, or the layout itself if not hierarchical, is bounded by a bounding box which encloses all objects and cell and array instances of the layout. The overall area of the layout is minimized by reducing the area of the bounding box. To model this area as a linear objective, the area can be approximated as a weighted sum of position variables representing the edges of the bounding box. For example, the bounding box 2 in FIG. 7 is the bounding box of a layout containing the layout object N. The left and right sides of the bounding box are represented by the position variables $x_s$ and $x_t$, respectively, and the bottom and top sides by the position variables $y_s$ and $y_t$, respectively. Generally, $x_s$ and $y_s$ can also be constants such as zero or some user provided location. The width and height of the bounding box before compaction are w and h, which are used as constant weights in the approximation of the bounding box area objective. For the preferred embodiment of the present invention, the objective function used to minimize the area of the layout in FIG. 7 is $w(y_t-y_s)+h(x_t-x_s)$. To keep the layout object N within the bounding box 2, linear constraints are needed as follows:

$$x_t \geq x_{12}$$

$$x_s \leq x_{11}$$

$$y_t \geq y_{12}$$

$$y_s \leq y_{11}$$

For the general case, linear constraints are needed to every layout object, cell and array instance adjacent to the bounding box of the layout. In addition to the primary objective of minimizing the overall layout area using the bounding box area objective, secondary objectives can be added to the two dimensional compaction objective function. An example of secondary objectives is to minimize the area of each layer used in a layout. Considering the layout object N in FIG. 7, a secondary objective is to minimize the area of N. Similar to the bounding box 2, the area of N is approximated as $w_N(y_{12}-y_{11})+h_N(x_{12}-x_{11})$, where $w_N$ and $h_N$ are the width and height of the bounding box before compaction and are treated as constants. This linear function can be added to the bounding box area approximation, each weighted by additional constant coefficients $Z_1$ and $Z_2$ as follows:

$$z_1(w_N(y_{12}-y_{11})+h_N(x_{12}-x_{11}))+z_2(w(y_t-y_s)+h(x_t-x_s))$$

In general, compaction objectives can be complex and can be used to optimize a layout for many criteria. The present invention is not limited to objectives of reducing layout area and/or layer area, but can be any analytical objective function. The preferred embodiment of the present invention is a linear objective function that represents the sum of all objectives.

The preferred embodiment of the present invention yields a linear program for two dimensional compaction of any layout, with or without hierarchy, of the form:

minimize $c^T x$ subject to $Ax=b$ where x is a vector of position variables for all layout elements, c is a vector of coefficients for the two dimensional compaction objective ($c^T$ is the transpose of c), A is a matrix of coefficients for the linear constraints and b is a vector or linear constraint distances. The vectors c and b and the matrix A are constant and the goal is to find a optimum solution to the vector x, which is variable. In general, the matrix A is very sparse due to the fact that nearly all design rule interactions and circuit requirements are localized to very small areas of the layout. As a result, the linear program above can be solved efficiently with any sparse implementation of a linear program method, including a sparse implementation of the Revised Simplex algorithm or a sparse implementation of an Interior Point method. Both methods can be obtained commercially from a number of vendors, including CPLEX from ILOG, MINOS from Stanford Business Software, Inc. and OSL from International Business Machines (IBM). These vendors provide executable machine code for all common types of computers, such as Sun Microsystems Workstations or Intel Architecture Personal Computers. Once the above linear program is solved, the values of x represent the compacted positions of all layout elements, which were optimized according to the objective function $c^T x$. The layout can then be updated using these values and the compaction method is complete.

To improve the results of the compaction method described above, some of the constraints related to corner to corner design rule interactions may need to be revisited. Any heuristic can be used to improve the solution, but the preferred embodiment of the present invention uses a greedy heuristic based upon the cost of the constraints resulting from solving the linear program. In addition to the optimum values x, all linear program methods produce cost values $\lambda$ for all constraints in the linear program. The most critical constraints, likely those affecting the layout area, have the highest cost and are considered before less critical, or lower cost, constraints. The heuristic selects the highest cost constraint corresponding to a corner to corner interaction where the choice of constraint region is wrong (see FIG. 2(b)). The constraint is removed from the linear program and a new constraint is added according the current region and the linear program is then resolved. To save time, the linear program can be resolved starting with the last known solution and using an incremental solving method. The process of changing constraints and resolving the linear program repeats until all constraint regions are optimal, or until constraints with cost above a user specified threshold have been visited. Many variations to this heuristic can be used with the present invention, but the heuristic described here works well in practice. The present invention is not limited to this heuristic nor to applying a heuristic to revisit other interactions, such as corner to edge or edge to edge interactions.

Figure 8:
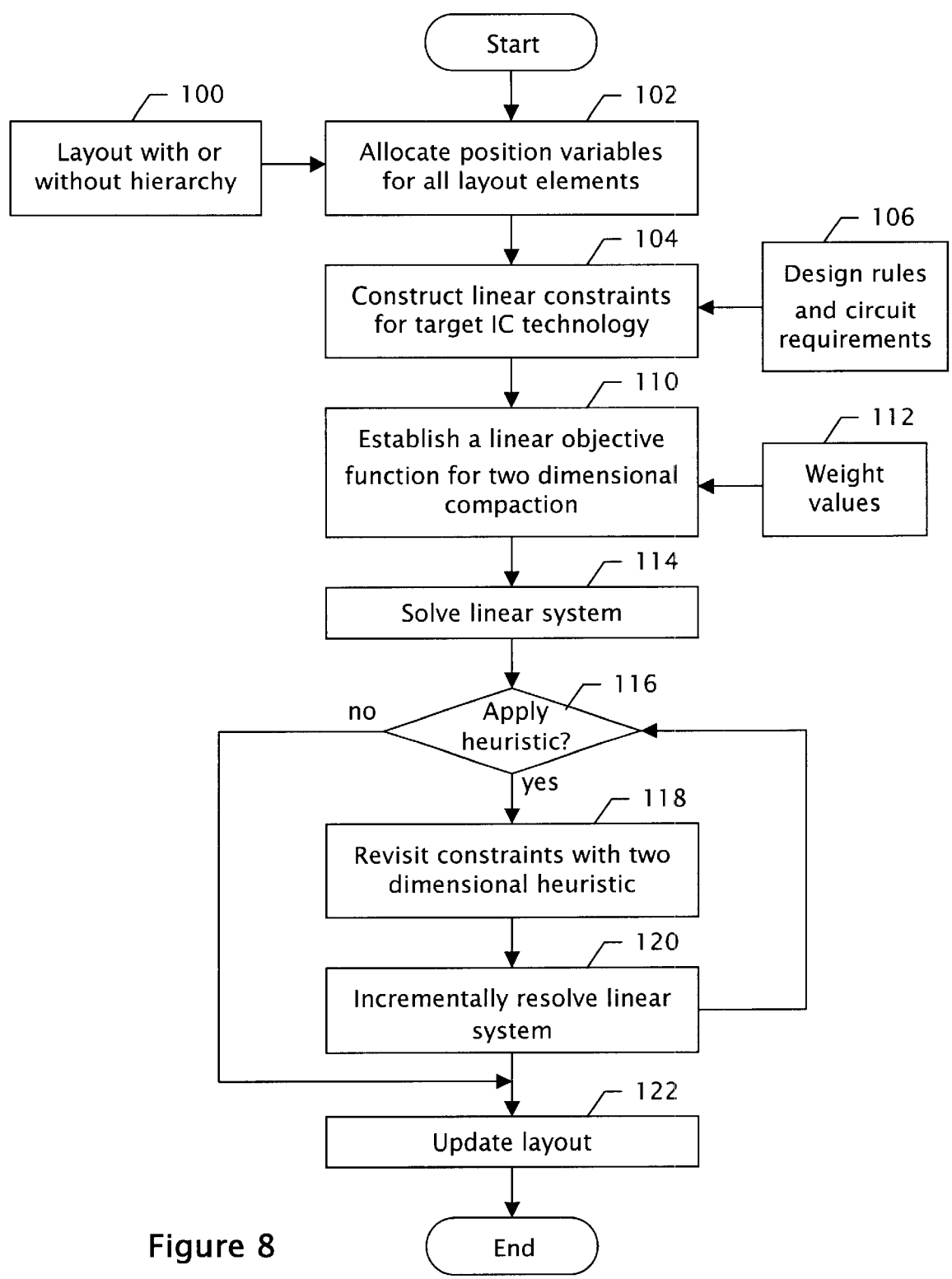
FIG. 8 shows a block/flow diagram of a system for the two dimensional compaction method.

A block/flow diagram of the present invention is shown in FIG. 8. The elements shown in FIG. 8 may be implemented in various forms of hardware, software or combinations thereof. Preferably, these elements are implemented in software on one or more appropriately programmed general purpose computers having a processor and memory and input/output interfaces. A layout with a plurality of layout objects and organized into a single level or hierarchical structure, which is a plurality of cell masters and cell and/or array instances, having initial positions for at least one layer and often a plurality of layers is input from block 100 into block 102. In block 102, position variables are determined and allocated for all layout objects, cell instances and array instances, and bounding boxes. The variables determine the location of all layout elements during compaction and are used to update the layout. Design rules and circuit requirements are input to block 104 from block 106.

In block 104, a system of linear constraints which describe separations or alignments between layout edges or points on the same or different layers rules based on design rules, the layout hierarchical structure, if any, the layout topology, and any other user provided or automatically generated constraint are formulated to be solved. An example of a constraint is $x_j - x_i > d_{ij}$. The system of linear constraints includes all constraints needed to adequately constrain the layout 100 in two dimensions without decision variables. Decisions regarding constraints between layout corners are made based on the initial positions of the corners and later revisited and altered heuristically.

In block 110, a linear objective function is formulated that will be optimized as part of the two dimensional compaction. The objective function is a weighted sum of the position variables allocated in 102. The weight factors 112 are input to 110 and used to establish the relative goals of minimizing the total layout area, minimizing/maximizing layer area, or other linear functions that need to be tallied to compose the final objective function. The weight factors 112 can be associated with the layout elements in any way and can be complex functions involving geometrical, electrical or other measurable metrics of the layout.

In block 114, the linear system of constraints is solved to compact and optimize the layout in two dimensions simultaneously. Linear programming or any combination of graph based, linear programming or other mathematical programming techniques may be used to solve the system. If the linear system can not be solved because the objective function is unbounded or the linear constraint system is infeasible, then the method terminates and the unbounded variables or infeasible constraints are reported. Normally the linear system can be solved and the layout can be updated in block 122, unless a decision 116 to apply the two dimensional heuristic is affirmative. If decision 116 is yes, the constraints are revisited in block 118 to achieve a better two dimensional compaction result. Block 118 alters one or more constraints in the linear system and the system is resolved in block 120. Blocks 118 and 120 can be repeated iteratively until a sufficiently good result is obtained, or the layout can be updated in block 122. The layout is modified in block 122 by implementing the solution of the linear system to provide new locations for the positions of all elements in the layout. In block 122, modifications are made to the layout in accordance with the design rules, layout hierarchy, or other constraints incorporated into the system of linear constraints. The entire compaction method can be performed again, if desired, but in general is not necessary to achieve a two dimensional compacted layout that obeys the design rules of the target technology.

Figure 9:
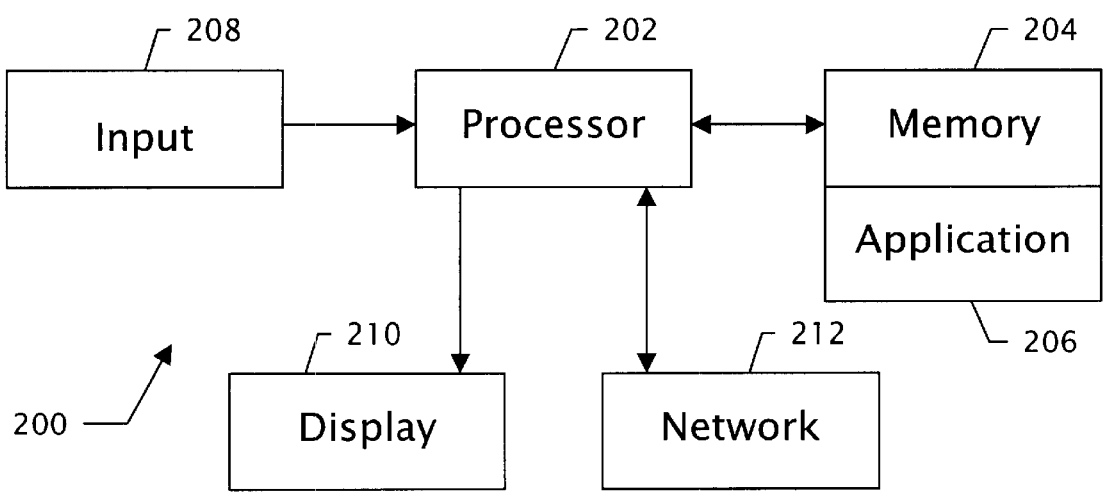
FIG. 9 shows a block/flow diagram of the system of the present invention.

A block/flow diagram for a system 200 of the present invention is shown in FIG. 9. System 200 includes a processor 202 that accesses a memory device 204. Memory device 204 stores an application software package 206 for implementing the present invention. A user may interface with the processor 202 through an input device 208, which may include a keyboard, a mouse, a trackball, a touch screen monitor, a voice recognition system or other known input device. A display device 210 displays results, prompts, user inputs, graphics, etc. A network 212 is also included to connect to other processors or networks over a local or wide area.

Having described preferred embodiments of a novel two dimensional compaction system and method (which are intended to be illustrative and not limiting), modifications and variations can be made by persons skilled in the art in light of this disclosure. Changes may be made in the particular embodiments of the invention disclosed which are within the scope and spirit of the invention.

What is claimed:

1. A two dimensional compaction method implemented in a computer, comprising:
   receiving a plurality of layout elements;
   determining and allocating one or more position variables to each of the plurality of layout elements, wherein the position variables determine the location of the edges or points of the plurality of layout elements and are used to update the layout;
   constructing a linear system of constraints using the position variables, wherein the constraints describe the relationships between edges or points of the plurality of layout elements;
   establishing a linear objective function that will be optimized as part of the two dimensional compaction that is a weighted sum of the allocated position variables; and
   solving the linear system of constraints to compact and optimize in two dimensions simultaneously.

2. The method of claim 1, wherein the layout is organized in a single level.

3. The method of claim 1, wherein the layout is organized in a hierarchical structure comprising a plurality of cell masters and cells and/or array instances.

4. The method of claim 1, wherein the step of constructing linear constraints is subject to a target IC technology.

5. The method of claim 1, wherein the step of constructing linear constraints is subject to design rules and circuit requirements.

6. The method of claim 1, wherein the step of establishing a linear objective function includes receiving weight factors to minimize the total layout area and/or minimize or maximize the layer area.

7. The method of claim 6, wherein the weight factors define geometrical, electrical, or other measurable metrics of the layout.

8. The method of claim 1, wherein the step of solving the linear system of constraints includes use of linear programming, graph based programming, or a combination of linear and graph based programming.

9. The method of claim 1, wherein at least one edge is non-orthogonal with respect to another edge.

10. A two dimensional method implemented in a computer, comprising:
    receiving a plurality of layout elements;
    allocating one or more variables to each of the plurality of layout elements;
    constructing a linear system of constraints using the variables, wherein the constraints describe the relationships for the plurality of layout elements;
    establishing a linear objective function using the variables; and
    solving the linear objective function subject to the linear system of constraints to optimize in two dimensions.

11. The method of claim 10, wherein the layout is organized in a single level.

12. The method of claim 10, wherein the layout is organized in a hierarchical structure comprising a plurality of cell masters and cells and/or array instances.

13. The method of claim 10, wherein the step of constructing linear constraints is subject to a target IC technology.

14. The method of claim 10, wherein the step of constructing linear constraints is subject to design rules and circuit requirements.

15. The method of claim 10, wherein the step of establishing a linear objective function includes receiving weight factors to minimize the total layout area and/or minimize or maximize the layer area.

16. The method of claim 15, wherein the weight factors define geometrical, electrical, or other measurable metrics of the layout.

17. The method of claim 10, wherein the step of solving the linear system of constraints includes use of linear programming, graph based programming, or a combination of linear and graph based programming.

18. A two dimensional compaction method implemented in a computer, comprising:
    receiving a plurality of layout elements;
    determining and allocating one or more position variables to each of the plurality of layout elements, wherein the position variables determine the location of the edges or points of the plurality of layout elements and are used to update the layout;
    constructing a linear system of constraints using the position variables, wherein the constraints describe the relationships between edges or points of the plurality of layout elements;
    establishing a linear objective function that will be optimized as part of the two dimensional compaction that is a weighted sum of the allocated position variables;
    solving the linear system of constraints to compact and optimize in two dimensions simultaneously; and
    determining whether to apply heuristics, wherein if heuristics are not to be applied, the method updates the layout, and wherein if heuristics are to be applied, the method revisits the linear constraints with a two dimensional heuristic, incrementally resolves the linear system, and updates the layout.

19. A two dimensional method implemented in a computer, comprising:
    receiving a plurality of layout elements;
    allocating one or more variables to each of the plurality of layout elements;
    constructing a linear system of constraints using the variables, wherein the constraints describe the relationships for the plurality of layout elements;
    establishing a linear objective function using the variables; and solving the linear objective function subject to the linear system of constraints to optimize in two dimensions, determining whether to apply heuristics, wherein if the heuristics are not to be applied, the method updates the layout, and wherein if heuristics are to be applied, the method revisits the linear constraints with a two dimensional heuristic, incrementally resolves the linear system, and updates the layout.

* * * * *